(12) United States Patent
Huber

(10) Patent No.: US 9,379,257 B2
(45) Date of Patent: Jun. 28, 2016

(54) ELECTRICAL DEVICE AND METHOD FOR MANUFACTURING SAME

(75) Inventor: Jakob Huber, Beyharting (DE)

(73) Assignee: Infineon Technologies AG, Neubiberg (DE)

( * ) Notice: Subject to any disclaimer, the term of this patent is extended or adjusted under 35 U.S.C. 154(b) by 231 days.

(21) Appl. No.: 13/531,284

(22) Filed: Jun. 22, 2012

(65) Prior Publication Data

US 2013/0341621 A1    Dec. 26, 2013

(51) Int. Cl.
*H01L 29/66* (2006.01)
*H01L 29/868* (2006.01)
*H01L 27/02* (2006.01)

(52) U.S. Cl.
CPC .......... *H01L 29/868* (2013.01); *H01L 27/0255* (2013.01)

(58) Field of Classification Search
CPC ... H01L 29/73; H01L 29/7371; H01L 29/732; H01L 29/7397
USPC .......... 257/197, 199, 565, 586, 589, E29.174, 257/E29.336; 438/328
See application file for complete search history.

(56) References Cited

U.S. PATENT DOCUMENTS

| | | | | |
|---|---|---|---|---|
| 3,631,311 A | * | 12/1971 | Engbert | 257/577 |
| 5,111,265 A | * | 5/1992 | Tanaka | 257/25 |
| 5,828,100 A | * | 10/1998 | Tamba et al. | 257/328 |
| 6,049,098 A | * | 4/2000 | Sato | 257/198 |
| 6,057,558 A | * | 5/2000 | Yamamoto | H01L 29/0847 257/330 |
| 6,590,240 B1 | * | 7/2003 | Lanois | H01L 29/0634 257/256 |
| 6,849,871 B2 | * | 2/2005 | Ning | 257/47 |
| 7,608,867 B2 | | 10/2009 | Charbuillet et al. | |
| 7,737,533 B2 | | 6/2010 | Dai et al. | |
| 7,932,133 B2 | | 4/2011 | Cogan et al. | |
| 8,288,839 B2 | | 10/2012 | Guan et al. | |
| 2006/0186437 A1 | * | 8/2006 | Aoki | H01L 29/41708 257/197 |
| 2006/0216913 A1 | | 9/2006 | Kung et al. | |
| 2009/0283797 A1 | * | 11/2009 | Takahashi | H01L 29/7397 257/139 |

FOREIGN PATENT DOCUMENTS

| | | |
|---|---|---|
| CN | 1722470 A | 1/2006 |
| CN | 200972861 Y | 11/2007 |
| CN | 101180709 A | 5/2008 |
| CN | 101501856 A | 8/2009 |
| CN | 101877358 A | 11/2010 |
| CN | 201898136 U | 7/2011 |

* cited by examiner

*Primary Examiner* — Kenneth Parker
*Assistant Examiner* — John Lin
(74) *Attorney, Agent, or Firm* — Slater Matsil, LLP

(57) ABSTRACT

An electrical device includes a first layer, a second layer and an intrinsic layer. The first layer is of a first conductivity type, wherein the second layer is of a second conductivity type opposite to the first conductivity type. The intrinsic layer is arranged between the first and the second layer and has a reduced thickness at at least one portion. An area of the at least one portion is less than 50% of an active area in which the first and second layer face each other.

21 Claims, 8 Drawing Sheets

ELECTRICAL DEVICE AND METHOD FOR MANUFACTURING SAME

TECHNICAL FIELD

Embodiments of the invention refer to an electrical device having a reduced turn on time and to a method for manufacturing an electrical device. Preferred embodiments refer to a diode and transistor having a reduced turn on time.

BACKGROUND

A transistor is an electrical device which has an adaptable transfer characteristic such that a signal may be amplified or switched. In a wider sense also a transistor can be seen as a diode if, e.g., its base is left floating. A diode has an asymmetric transfer characteristic. So, a diode may be used for conducting a current in a forward direction and for blocking a current in a reverse direction. A frequently used diode is a semiconductor diode, which comprises two different semiconductor materials of opposite conductive type so that a pn-junction is formed between the two materials. By varying the semiconductor materials the transfer characteristic may be adjusted. Often semiconductor diodes have a nonlinear current-voltage characteristic such that same may be used to regulate voltages or to protect circuits.

For example, a transient voltage suppressor diode is used for protecting a circuit from high voltage surges. Such a transient voltage suppressor diode, also referred to as avalanche diode, is designed to go through avalanche breakdown (in the reverse direction) at a specific reverse bias voltage. The time difference between the point of time of the high voltage surge and the avalanche breakdown is called turn on time. Transient voltage suppressor diodes or, in general, electrical devices are often optimized regarding its turn on time.

SUMMARY OF THE INVENTION

An embodiment provides an electrical device which comprises a first layer, a second layer and an intrinsic layer. The first layer is of a first conductivity type, wherein the second layer is of a second conductivity type opposite to the first conductivity type. The intrinsic layer is arranged between the first and the second layer and has a reduced thickness at at least one portion. An area of the at least one portion is less than 50% of an active area in which the first and the second layer face each other.

A further embodiment provides an electrical device having a vertical layer arrangement. The layer arrangement comprises a substrate having a lower layer of a first conductivity type, and upper layer of a second conductivity type opposite to a first conductivity type and an intrinsic layer which is arranged between the lower layer and the upper layer. Furthermore, the layer arrangement comprises one or more indenters which extend from the upper layer into the intrinsic layer such that the intrinsic layer has a reduced thickness at at least one portion, wherein an area of the one or more indenters is less than 30% of an active area in which the first and the second layer face each other. The indenters comprise polysilicon and have a depth which is at least 10% smaller compared to a thickness of the intrinsic layer, wherein the indenters are of the second conductivity type.

A further embodiment provides a transient voltage suppressor diode which comprises a first layer of a first conductivity type arranged on a substrate of a second conductivity type opposite to the first conductivity type, a second layer of the second conductivity type and an intrinsic layer arranged between the first and the second layer. The intrinsic layer has a reduced thickness at at least one portion, wherein an area of the at least one portion is less than 30% of an active area in which the first and second layer face each other.

A further embodiment provides an electrical device comprising a first layer of a first conductivity type, a second layer of a second conductivity type opposite to the first conductivity type, and an intrinsic layer arranged between the first and the second layer. Furthermore, the electrical device comprises means for partially reducing a thickness of the intrinsic layer in order to reduce a turn on time of the electrical device.

A further embodiment provides a method for manufacturing an electrical device, the method comprising the steps of providing a first layer of first conductivity type and providing an intrinsic layer onto the first layer. Furthermore, the method comprises the steps of providing one or more trenches into the intrinsic layer and filling the one or more trenches with a material of a second conductivity type opposite to the first conductivity type. The last step of the method is providing a second layer of a second conductivity type onto the intrinsic layer.

BRIEF DESCRIPTION OF THE DRAWINGS

Embodiments of the present invention are described in the following with respect to the figures, among which.

DETAILED DESCRIPTION OF ILLUSTRATIVE EMBODIMENTS

Figure 1:
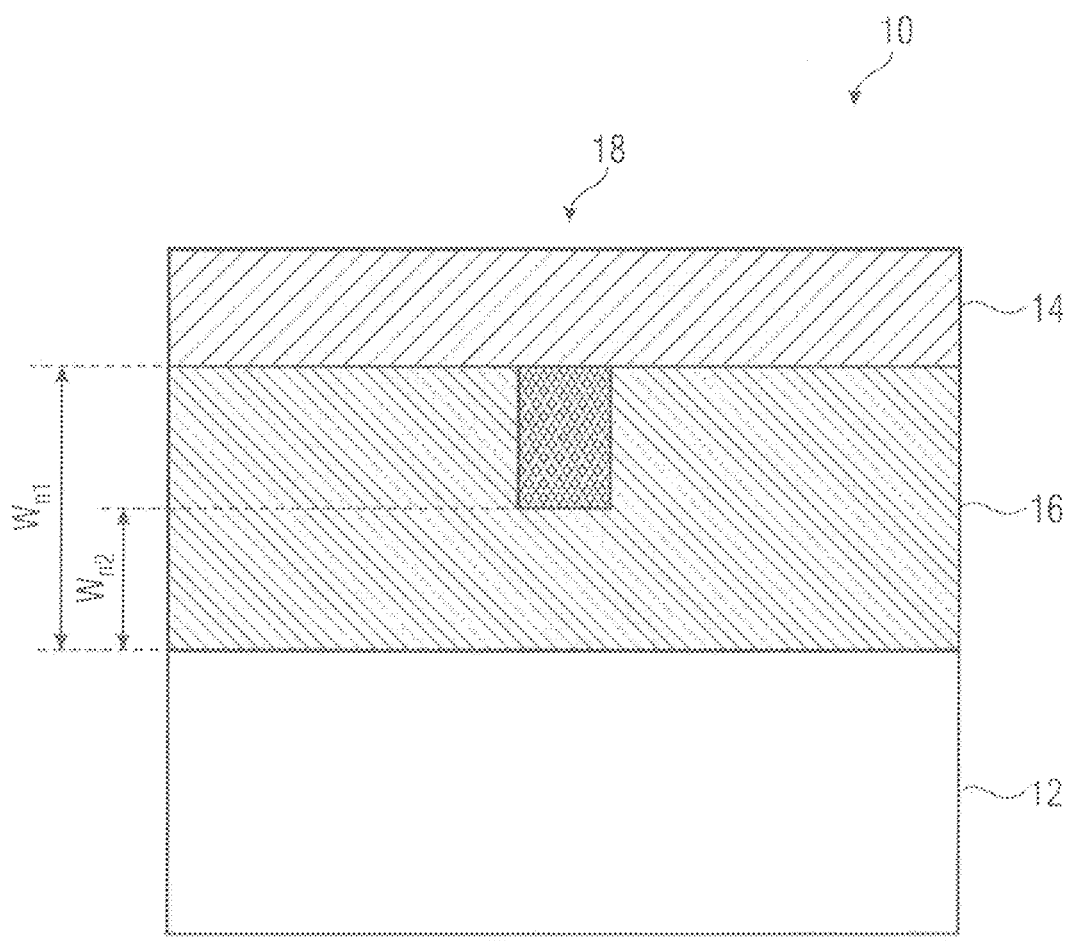
FIG. 1 exemplarily shows a cross-sectional view of an electrical device comprising an intrinsic layer having a partially reduced thickness according to an embodiment.

Different embodiments of the teachings disclosed herein will subsequently be discussed referring to FIG. 1 to FIG. 5. In the drawings, identical reference numerals are provided to objects having identical or similar functions so that objects referred to by identical reference numerals within the different embodiments are interchangeable and the description thereof is mutually applicable.

FIG. 1 shows an electrical device 10 comprising a first layer 12 and a second layer 14, wherein an intrinsic layer 16 is arranged between the first and the second layer 12 and 14. The first layer 12 is of a first conductivity type, for example, an n+ doped layer, wherein the second layer 14 is of a second conductivity type opposite to the first conductivity type, for example, a p+ doped layer. The two layers 12 and 14 are arranged such that same face each other and form an active area with a pn-junction in between. Between the facing (parallel) layers 12 and 14 the intrinsic layer 16 is arranged, which may have a low doping concentration, e.g., n—(i.e., approx. 1e13 cm$^{-3}$). In general, an intrinsic layer 16 has such a low doping that the layer is depleted of all free carriers even if no bias is applied. The intrinsic layer 16 which may be an epi layer has a reduced thickness $w_{n2}$ (e.g., 2 to 10 µm) at least one portion compared to a thickness $w_{n1}$ (e.g., 5 to 20 µm) of the intrinsic layer 16. It should be noted that this area 18 of the at least one portion is less than 50%, or less than 30% or even less than 10% of the active area in which the layers 12 and 14 are overlapping.

Due to the intrinsic layer 16 (depleted zone) in between a so-called PIN diode 10 is formed. Such a PIN diode 10 may be used in forward mode operation as a bypass diode for ESD (electrostatic discharge) protection, especially for circuits having just one polarity. The PIN diode 10 has preferably a small capacity depending on the thickness $w_{n1}$ of the intrinsic layer 16. A reduced capacity may be achieved by an increase of the thickness $w_{n1}$ (base width $w_{n1}$). However, due to the increase of the entire thickness $w_{n1}$ the time for switching between the blocking state into the conducting state is also increased. This time is called turn on time t and is defined by the formula $$t = w_{n1}^2 / 2\mu,$$

where µ is the mobility of the minority carriers within the base and the intrinsic layer 16, respectively. This increased turn on time t in combination with the small capacity may lead to an overshoot voltage which is built up during the turn on time t. Background thereon is that electrical charges of an applied current surge, which cannot be discharged while the diode 10 is in the blocking state, are charged into the diode 10 and build up the overshoot voltage due to the small the capacity. Therefore, it is the goal to reduce the turn on time t in order to avoid the overshoot voltage while maintaining the small capacity of the device 10. So, embodiments of the invention are based on the principle that the thickness $w_{n2}$ of the intrinsic layer 16 is just partially reduced, namely in the area 18. Background thereof is that the capacitance depends primarily on the area, wherein the turn on time t depends primarily on the base width $w_{n2}$. Therefore, the base width $w_{n2}$ is just reduced in the limited area 18. In other words, the area 18 having the reduced thickness $w_{n2}$ forms a further diode connected in parallel to the PIN diode 10, wherein the further diode has a reduced turn on time t. Due to the limited area 18, e.g., 5% of the active area, the turn on time t may significantly be reduced, while the capacitance is changed only a little bit.

In this embodiment, the area 18 of the portion having the reduced thickness $w_{n2}$ may be realized by a trench which extends, for example, 4 µm or 6 µm, into the intrinsic layer 16 and is filled by the material of the second layer 14. The trench and thus a portion of the second layer 14 extend typically more than 30% or 50% of the thickness $w_{n1}$ of the intrinsic layer 16 into the intrinsic layer 16.

Figure 2A:
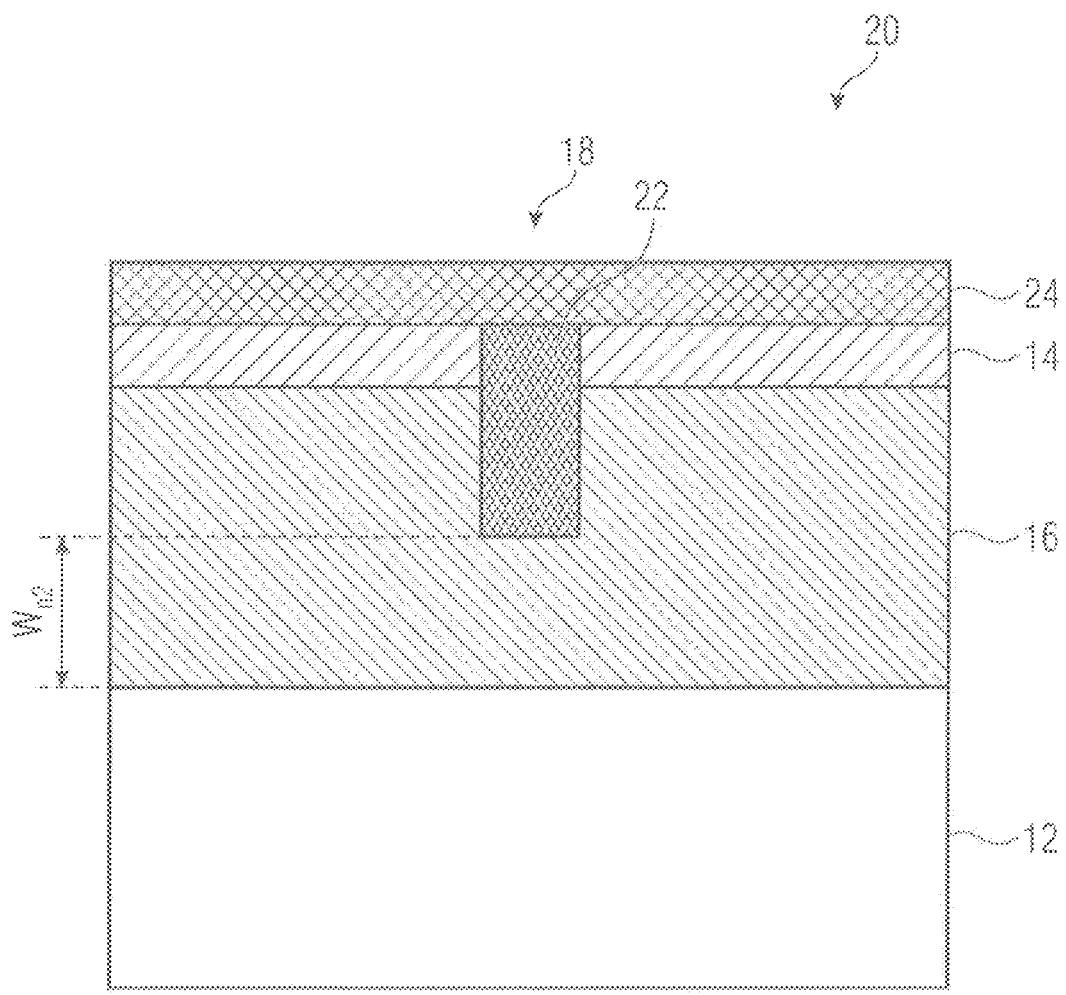
FIG. 2a exemplarily shows a cross-sectional view of an electrical device comprising an indenter for partially reducing a thickness of an intrinsic layer according to an embodiment.

FIG. 2a shows an electrical device 20 which substantially corresponds to the electrical device 10, wherein the area 18 having the reduced thickness $w_{n2}$ is formed by an indenter 22. The indenter 22 extends from the second layer 14 into the intrinsic layer 16 up to a depth of 50% or 80% of the thickness $w_{n1}$. The indenter 22 comprises a material which is of the same conductivity type of the second layer 14, for example, a p or p+ doped polysilicon, and is connected to the second layer 14. Here, the indenter 22 is provided after providing the second layer 14 (upper layer) such that same extends through the thin upper layer 14 (thickness preferentially smaller compared to the thickness of the intrinsic layer 16, e.g., less than 1 µm) into the intrinsic layer 16.

As explained above, the indenter 22 has the purpose to reduce partially the thickness $w_{n2}$ of the intrinsic layer 16 in order to speed up the turn on time t.

According to another embodiment, the electrical device 20 may comprise an optional metallization layer 24 arranged on the upper layer 14 for electrically contacting the layer 14 (anode contact). The lower layer 12 may be electrically contacted via the substrate (cathode contact) which comprises the lower layer 12. So, the lower layer 12 may be arranged on the substrate or may be formed by the substrate which is, for example, doped. It should be noted that according to a further embodiment, in which reverse conductivity types are provided (substrate p doped and upper layer 14 n doped) the substrate forms the anode contact and the upper layer 14 the cathode contact.

Figure 2B:
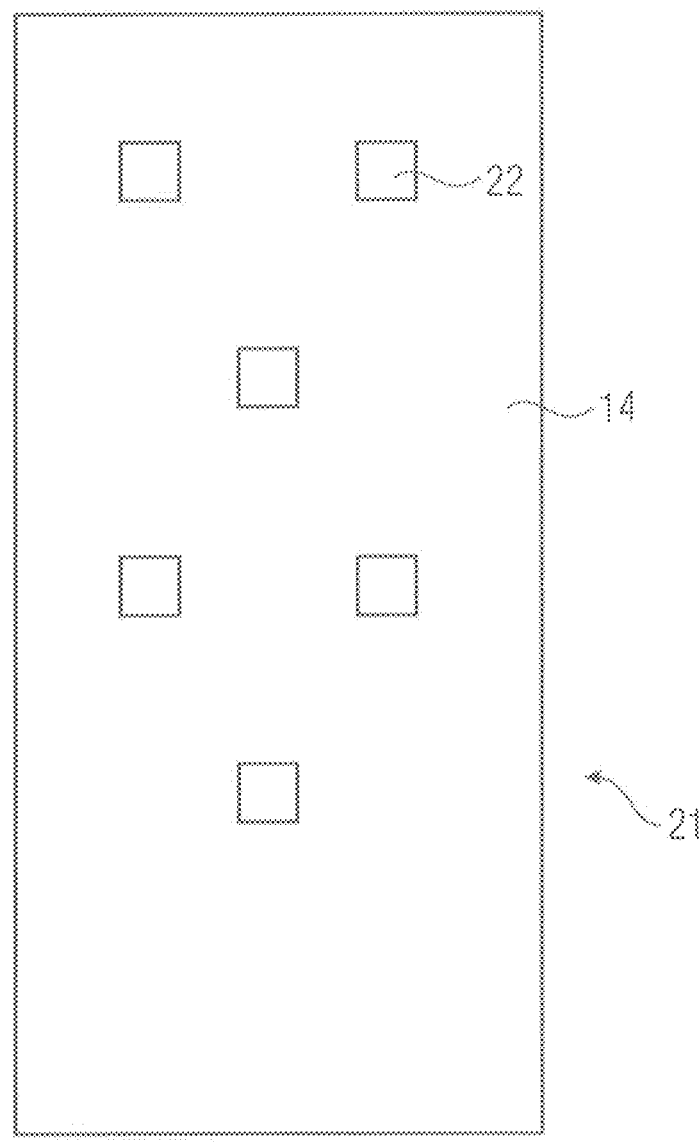
FIG. 2b exemplarily shows a top view of an electrical device comprising a plurality of indenters according to an embodiment.

FIG. 2b shows a top view of an electrical device 21 which is substantially equal to the electrical device 20 of FIG. 2a, but further comprises a plurality of indenters 22. The indenters 22 are arranged in the same active area and embedded into the upper layer 14 and into the intrinsic layer (not shown).

Thus, a plurality of diodes, which are connected in parallel to the proper electrical device 21 and to the diode 21, respectively, is formed by the plurality of indenters 22. According to further embodiments, the square-shaped indenters 22 which may have a size of 2×2 µm$^2$ may be laterally evenly distributed over the active area such that the entire area of the plurality of indenters 22 is less than 50% or 10% of the active area. Therefore, a distance between two adjacent indenters 22 is typically larger than three times or five times a diameter or a side length of the respective indenter 22.

Figure 3A:
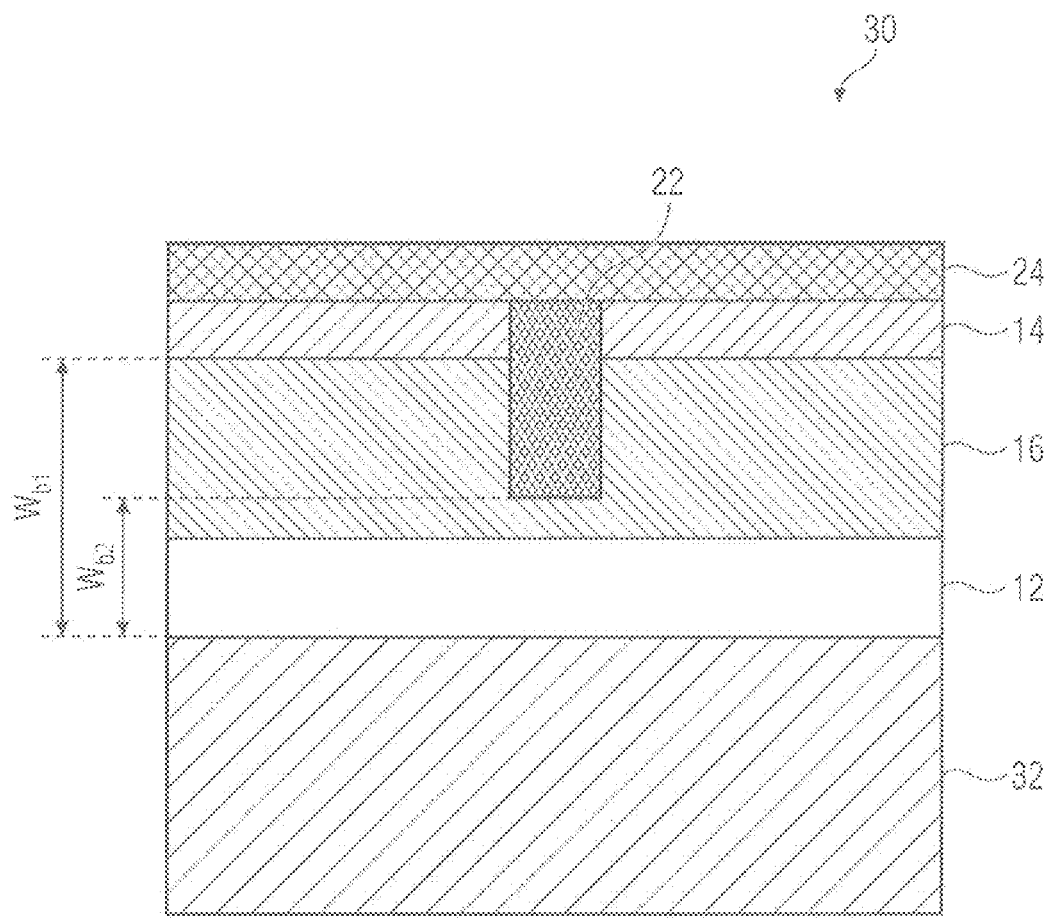
FIGS. 3a to 3b exemplarily show cross-sectional views of electrical devices comprising indenters according to further embodiments.
Figure 3B:
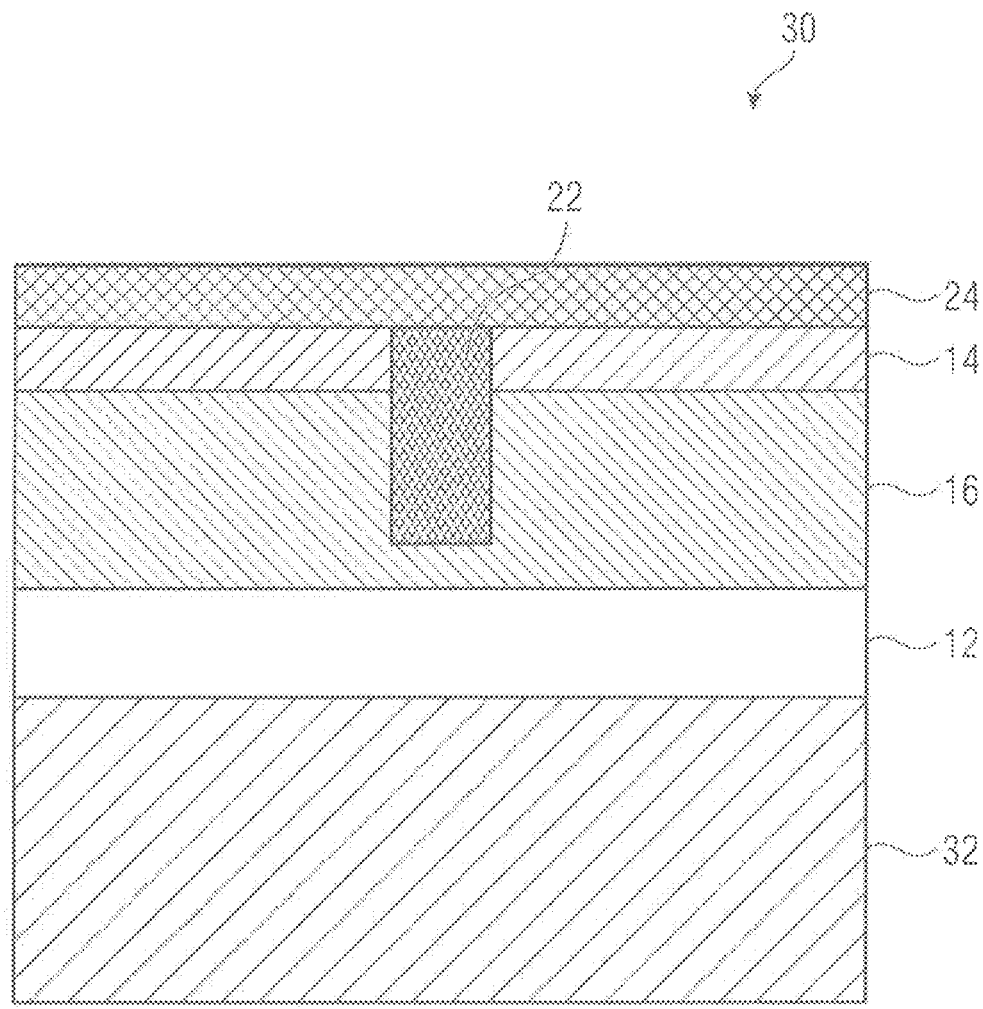

FIGS. 3a and 3b show a further electrical device 30. The electrical device 30 comprises the lower layer 12, e.g., a p doped layer, arranged on a substrate 32, e.g., an n+ doped substrate. Further, the electrical device 30 comprises the upper layer 14, e.g., an n+ doped layer, and the intrinsic layer 16 between the lower and upper layer 12 and 14. As in the embodiment of FIG. 2a, the indenter 22 extends from the upper layer 14 into the intrinsic layer 16 in order to partially reduce the thickness of the intrinsic layer 16. Optionally, the electrical device 30 may comprise the metallization layer 24 for electrically connecting the upper layer 14.

In this embodiment, the electrical device 30 may be used as a transistor wherein the substrate 32 forms the collector, the upper layer 14 the emitter, and the lower layer 12 together with the intrinsic layer 16 the base. Consequently, the base width $w_{b1}$ is defined by the distance between the collector 32 (pn-junction) and the emitter 14. In the same way as the embodiment of FIG. 2, the turn on time t of the electrical device 30 is reduced by locally reducing the base width $w_{b2}$ compared to the base width $w_{b1}$ (wherein the reduced base width $w_{b2}$ complies with the distance between the collector 32 and the indenter 22). Consequently, a capacity surge may be avoided. Expressed in other words, the indenter 22 forms a parallel transistor (connected in parallel to the transistor 30) which has a reduced turn on time t which is in quadratic portion to the reduced base width $w_{b2}$. According to another embodiment, the electrical circuit 30 may comprise a plurality of indenters 22, as shown with respect to FIG. 2b.

In case the base is left floated, the shown device 30 forms a diode, namely a so-called transient voltage suppressor (TVS) diode which has the purpose to protect electronic circuits against damaging high voltages. The transient voltage suppressor diode 10, also referred to as Zener or Avalanche diode, is typically connected to the circuit so that it is reverse biased, e.g., via the n-type side (cf. layer 12). Here, the transient voltage suppressor diode 10 is non-conducting if the voltage is below the avalanche breakdown voltage, e.g., 30 V or 70 V.

If the voltage exceeds beyond this avalanche breakdown voltage, e.g., in case of a high voltage surge, the diode goes from the blocking state into the avalanche state and begins to conduct the overshoot current, for example, to ground. The avalanche breakdown takes place at the junction between the substrate 32 and the lower layer 12. As explained above the turn on time t (switching from the blocking state to the avalanche state) is reduced due to the provided indenters 22.

Figure 4:
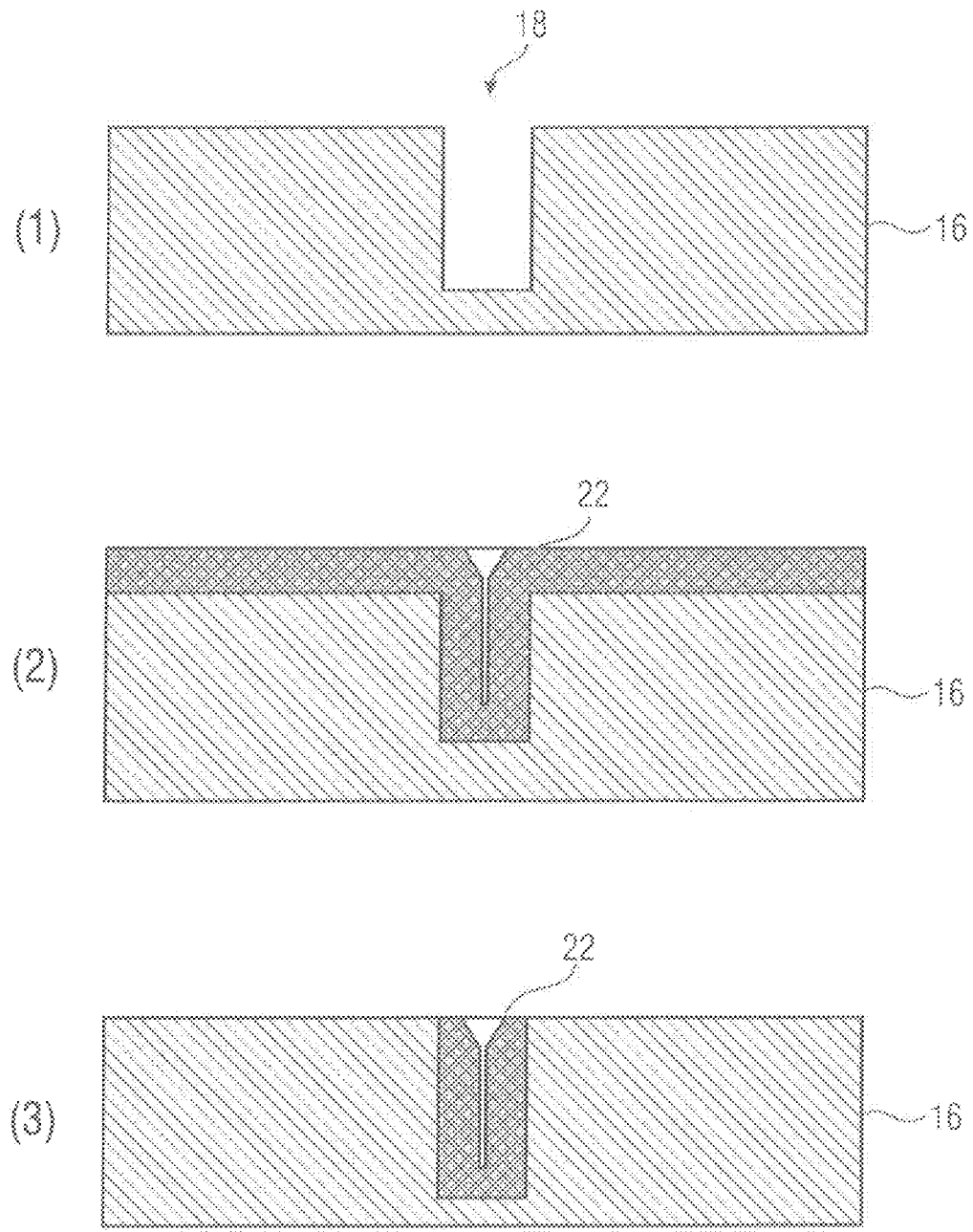
FIG. 4 exemplarily illustrates a method for manufacturing an electrical device comprising an intrinsic layer having a partially reduced thickness according to an embodiment.

FIG. 4 illustrates the method for manufacturing an electrical device comprising an indenter 22, wherein just the steps for reducing the thickness $w_{b1}$ of the intrinsic layer 16 and for providing the indenter 22 are illustrated.

So, the shown steps are performed after providing the lower (first) layer (not shown) and the intrinsic layer 16 onto the first layer. It should be noted that the intrinsic layer 16 is provided such that same has a constant thickness, for example, by using epitaxy. In order to partially reduce the thickness $w_{b1}$ of the intrinsic layer 16, same is etched in the area 18, e.g., by trench or deep trench etching (see step 1). The trench may, for example, have a depth of 4 μm or up to 16 μm or a depth which is smaller (at least, e.g., 2%, 5%, 10% or 30%) when compared to the thickness $w_{b1}$ of the intrinsic layer 16.

The next step is filling the trench with a material, e.g., a p doped polysilicon, of same doping type as the upper layer. This step may be performed by polysilicon depositing (cf. step 2). Due to the polysilicon depositing the surface of the intrinsic layer 16 is covered with polysilicon, too. This polysilicon may form the upper (second) layer 14 directly. According to another embodiment, the polysilicon on the surface may be removed (see step 3), e.g., by reactive ion etching (RIE), so that another second layer, e.g., with a different doping concentration, may be provided. Thus, the non-removed material in the trench (see area 18) forms the indenter 22 embedded in the intrinsic layer 16. After these three steps 1, 2 and 3, the second layer 14 may be provided such that same has the conductivity type of the indenter 22 (if applicable with different doping concentration) and such that same is electrically connected to the indenter 22.

It should be noted that the three illustrated steps of providing the trench (step 1), filling the trench with doped material (step 2), and removing the doped material from the surface (step 3) may, alternatively, be performed after providing the upper (second) layer 14 such that the indenter 20 extends through the upper layer 14.

Figure 5A:
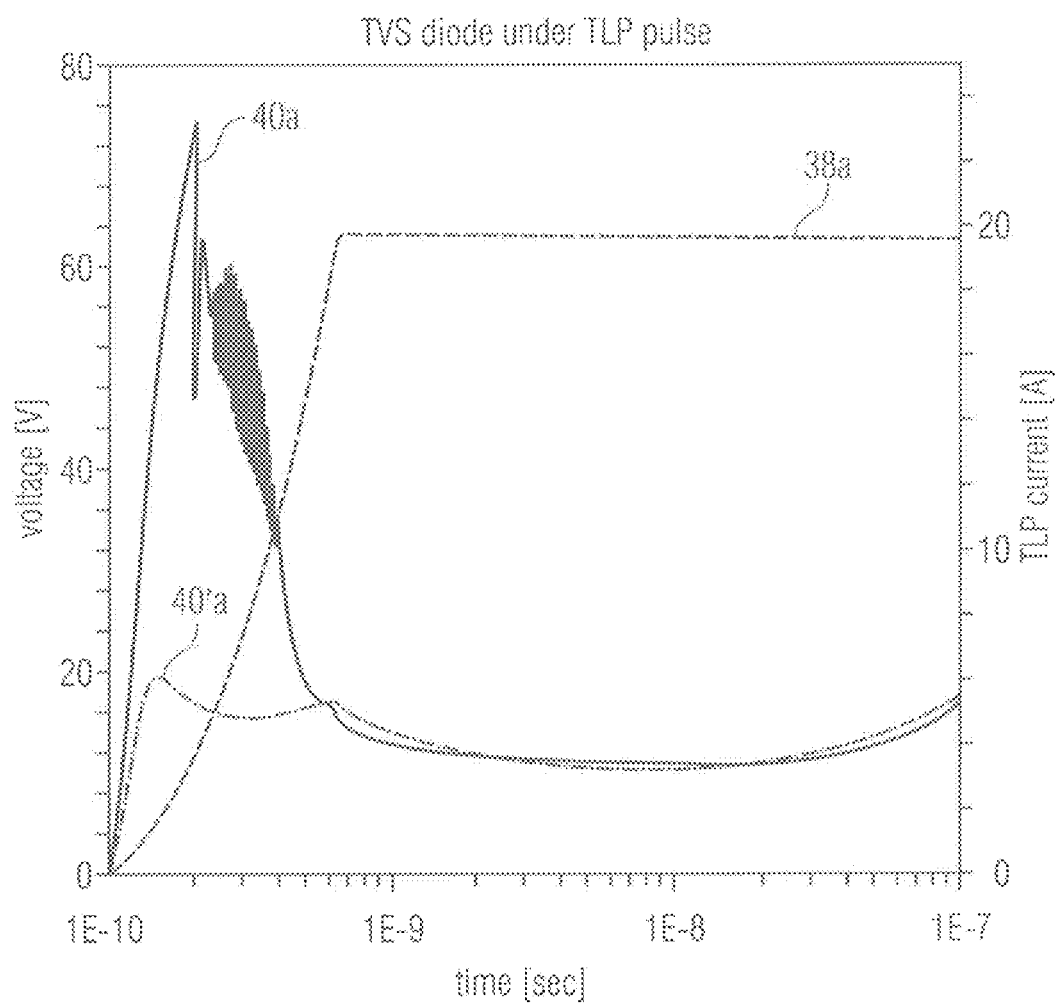
FIGS. 5a to 5b show two exemplary diagrams resulting from a device simulation of a TVS diode and a pin diode according to embodiments for illustrating turn on time improvements.
Figure 5B:
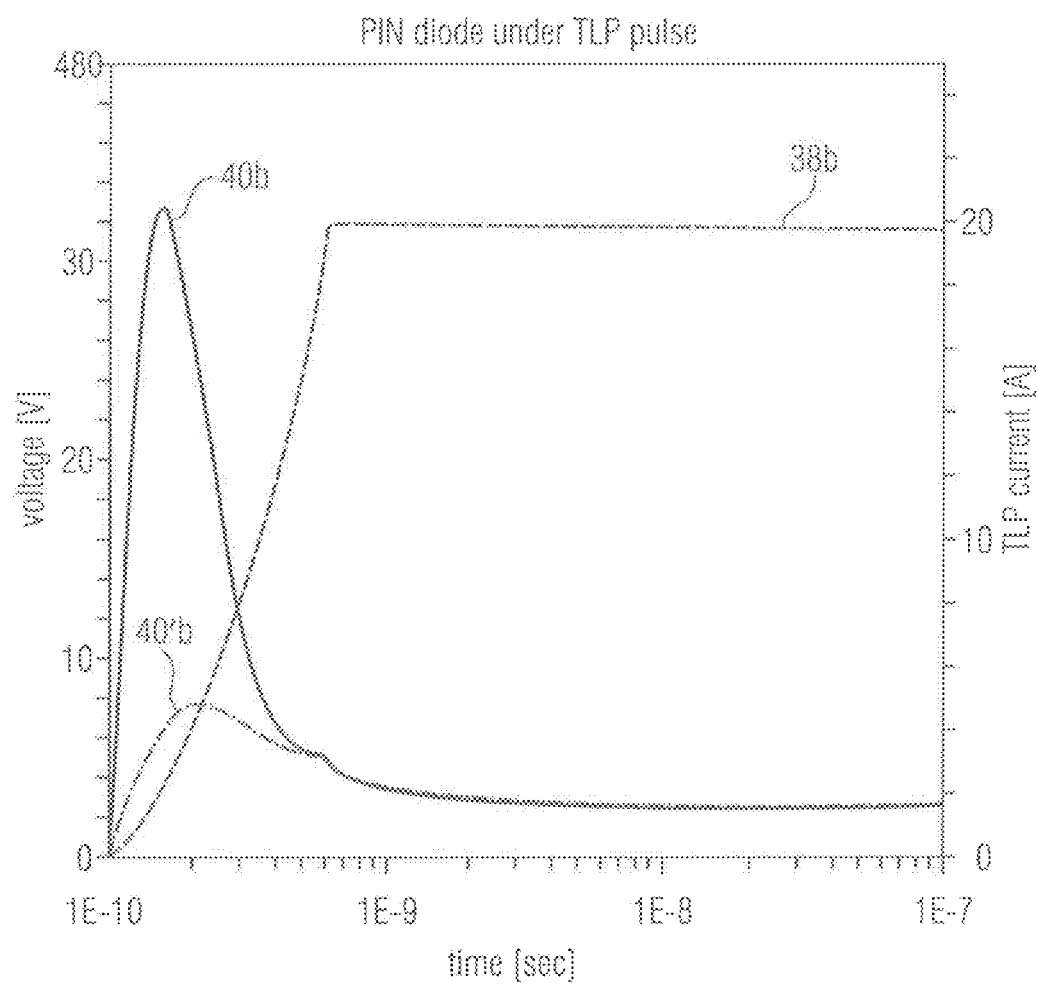

In FIGS. 5a and 5b the results of two device simulations, namely the simulation of a TVS diode (avalanche mode operation) and of a PIN diode (forward mode operation), are illustrated. Such simulations are used to demonstrate the performance improvement by an arrangement according to the present invention. This evaluation method is based on a simulated transmission line pulse which is applied to the respective device within a 50Ω system. The result of each simulation is shown by a diagram of a voltage of the respective diode resulting from the transmission line pulse plotted over the time.

FIG. 5a shows the result for a 4000 μm² (TVS-) diode in avalanche mode operation to which a transmission line pulse 38a, e.g., a 20 ampere pulse, has been applied. This transmission line pulse 38a increases the current up 0.5 ns and forms a plateau (20 A) after that point of time. During this increase of the current a so-called overshoot voltage is built up due to the parasitic capacitance of the diode up to the point of time when the avalanche breakdown is completed setting on. The overshoot voltage for a conventional diode is marked by the reference numeral 40a, wherein the overshoot voltage for the improved diode comprising the indenter is marked by the reference numeral 40'a. As illustrated by the graph 40a for the conventional diode a maximum overshoot voltage of, e.g., 70V is built up before the diode goes into avalanche. Here, the avalanche breakdown begins at approximately 0.3 ns and is completed approximately after 0.6 ns (cf. 40a). The graph 40'a of the improved diode shows that nearly none overshoot voltage is built up due to the reduced turn on time t. That is, the improved diode conducts the current before the transmission line pulse has been set on completely.

FIG. 5b illustrates the result of the performance simulation of a PIN diode in the forward mode operation to which a 20 ampere transmission line pulse 38b has been applied. Similarly to the results illustrated in FIG. 5a the overshoot voltage 40b of a conventional PIN diode (e.g., 30 V) is avoided by using the improved version having a partially reduced base width $w_{n2}$ (cf. 40b) due to its reduced turn on time t.

Referring to FIG. 1 and FIG. 2a, it should be noted that the conductivity types of the layers 12 and 14 may be selected such that a NIP-diode is formed, i.e., that the layer 12 comprises a p+ dopant instead of an n+ dopant and the layer 14 comprises an n+ dopant instead of a p+ dopant. Analogously, the conductivity types used for the layers of the electrical circuit 30 may vary such that the substrate 32 may comprise a p+ dopant (instead of an n+ dopant), the lower layer 12 may comprise an n+ dopant (instead of a p+ dopant), and the upper layer 14 as well as the indenter 22 may comprise a p+ dopant (instead of an n+ dopant). According to an alternative embodiment, the applied doping concentration of the singular materials (e.g., for the first or second layer 12 and 14) may vary such that a lower (−) or higher (++) doping concentration may be used.

Referring to FIG. 1 it should be noted that the area 18 having the reduced thickness $w_{n2}$ is not necessarily embedded in the intrinsic layer 16. That is, the area 18 reduced regarding its thickness $w_{n2}$ may be arranged adjacent to an area of the intrinsic layer 16 having a non-reduced thickness $w_{n1}$. Expressed in other words, the intrinsic layer 18 is provides such that same forms a step.

Referring to FIG. 2b it should be noted that the size and the shape of the indenter 22 may, alternatively, be different so that the indenter 22 may have a round or elongated shape with diameter in the range between 1 μm and 10 or 20 μm.

Referring to FIGS. 3a and 3b, it should be noted that the shown vertical transistor 30 may comprise further layers like a buried layer which is a low-resistance layer embedded in a high-resistance substrate 32.

Although the layer arrangement of FIGS. 3a and 3b is explained in the context of a transistor, it should be noted that the layer arrangement may also be used as a transient voltage suppressor diode, wherein the substrate 32 forms the cathode and the upper layer 14 forms the anode. In case of NPN layer arrangement the substrate 32 forms the anode and the upper layer 14 the cathode.

In general, it should be noted that the embodiments described above are merely illustrative for the principle of the present invention. These principles may be applied to further electrical devices, for example to an insulated gate bipolar transistor (IGBT) or to another semiconductor device. Therefore, it is understood that modifications and variations of the arrangement and the details described herein will be apparent to others skilled in the art.

Therefore, it is the intent to be limited only by the scope of the appending patent claims and not by the specific details presented by way of description and explanation of the embodiments herein.

What is claimed is:

1. An electrical device comprising:
   a first layer of a first conductivity type;
   a second layer of a second conductivity type opposite to the first conductivity type; and
   an intrinsic layer arranged between the first and second layers, wherein the intrinsic layer has a reduced thickness at at least one portion, wherein an area of the at least one portion is less than 30% of an active area in which the first and second layers face each other,
   wherein the at least one portion of the reduced thickness is formed by one or more indenters having the second conductivity type, wherein the one or more indenters are electrically connected to the second layer and extend into the intrinsic layer, and
   wherein the one or more indenters are arranged in deep trenches so as to form a pin-junction between the one or more indenters and the first layer with the intrinsic layer in-between.

2. The electrical device according to claim 1, wherein a depth of the indenters is at least 10% smaller compared to a thickness of the intrinsic layer.

3. The electrical device according to claim 1, wherein the indenters comprise polysilicon.

4. The electrical device according to claim 1, wherein the area of the at least one portion has a square-shape, a circular-shape or oval-shape.

5. The electrical device according to claim 1, wherein more than one portions are laterally evenly distributed over the active area.

6. The electrical device according to claim 5, wherein a lateral distance between two adjacent laterally distributed portions is larger than three times a diameter the portion.

7. The electrical device according to claim 1, wherein the electrical device is a diode with a pn-junction formed between the first and second layers.

8. The electrical device according to claim 1, wherein the electrical device is a pin diode comprising a p dopant in areas of the first conductivity type and an n dopant in areas of the second conductivity type.

9. The electrical device according to claim 1, wherein the electrical device is a nip diode comprising an n dopant in areas of the first conductivity type and a p dopant in areas of the second conductivity type.

10. The electrical device according to claim 1, further comprising a substrate which comprises the first layer.

11. The electrical device according to claim 10, wherein the substrate is of the second conductivity type.

12. The electrical device according to claim 11, wherein the electrical device is a transistor, in which a collector is formed by the substrate, a base is formed by the first layer and the intrinsic layer and a emitter is formed by the second layer.

13. The electrical device according to claim 12, wherein a ratio of a reduced base-width and a base-width is smaller than $2/3$,
   wherein the base-width is a distance between the collector and the emitter, and wherein the reduced base-width is a distance between the collector and the area of the at least one portion.

14. The electrical device according to claim 12, wherein the transistor comprises a p dopant in areas of the first conductivity type and an n dopant in areas of the second conductivity type.

15. The electrical device according to claim 12, wherein the transistor comprises an n dopant in areas of the first conductivity type and a p dopant in areas of the second conductivity type.

16. The electrical device according to claim 10, wherein a buried layer is embedded in the substrate.

17. The electrical device according to claim 1, wherein areas of the intrinsic layer having different thicknesses are arranged adjacent to each other such that intrinsic layer forms a step.

18. The electrical device according to claim 1, wherein the deep trenches have a diameter being smaller than a depth of the deep trenches.

19. An electrical device having a vertical layer arrangement, the device comprising:
   a substrate comprising a lower layer of a first conductivity type;
   an upper layer of a second conductivity type opposite to the first conductivity type;
   an intrinsic layer arranged between the lower layer and the upper layer; and
   one or more indenters which extend from the upper layer into the intrinsic layer such that the intrinsic layer has a reduced thickness at at least one portion, wherein an area of the one or more indenters is less than 30% of an active area in which the lower and upper layers face each other,
   wherein the indenters comprise polysilicon and have a depth which is at least 10% smaller compared to a thickness of the intrinsic layer,
   wherein the indenters are of the second conductivity type,
   wherein the at least one portion of the reduced thickness is formed by one or more indenters having the second conductivity type, wherein the one or more indenters are electrically connected to the upper layer and extend into the intrinsic layer, and
   wherein the one or more indenters are arranged in deep trenches so as to form a pin-junction between the one or more indenters and the lower layer with the intrinsic layer in-between.

20. A transient voltage suppressor diode comprising:
   a first layer of a first conductivity type arranged on a substrate of a second conductivity type opposite to the first conductivity type;
   a second layer of the second conductivity type; and
   an intrinsic layer arranged between the first and second layers, wherein the intrinsic layer has a reduced thickness at at least one portion, wherein an area of the at least one portion is less than 30% of an active area in which the first and second layers face each other,
   wherein the at least one portion of the reduced thickness is formed by one or more indenters having the second conductivity type, wherein the one or more indenters are electrically connected to the second layer and extend into the intrinsic layer, and
   wherein the one or more indenters are arranged in deep trenches so as to form a pin-junction between the one or more indenters and the first layer with the intrinsic layer in-between.

21. An electrical device comprising:
   a first layer of a first conductivity type;
   a second layer of a second conductivity type opposite to the first conductivity type;
   an intrinsic layer arranged between the first and second layers; and
   means for partially reducing a thickness of the intrinsic layer in order to reduce a turn on time of the electrical device,
   wherein at least one portion of the reduced thickness is formed by one or more indenters having the second conductivity type, wherein the one or more indenters are electrically connected to the second layer and extend into the intrinsic layer, and wherein the one or more indenters are arranged in deep trenches so as to form a pin-junction between the one or more indenters and the first layer with the intrinsic layer in-between.

* * * * *